United States Patent
Choi et al.

(10) Patent No.: US 7,775,508 B2
(45) Date of Patent: Aug. 17, 2010

(54) AMPOULE FOR LIQUID DRAW AND VAPOR DRAW WITH A CONTINUOUS LEVEL SENSOR

(75) Inventors: Kenric T. Choi, Santa Clara, CA (US); Pravin K. Narwankar, Sunnyvale, CA (US); Shreyas S. Kher, Campbell, CA (US); Son T. Nguyen, San Jose, CA (US); Paul Deaton, San Jose, CA (US); Khai Ngo, Cedar Park, TX (US); Paul Chhabra, Austin, TX (US); Alan H. Ouye, San Mateo, CA (US); Dien-Yeh (Daniel) Wu, San Jose, CA (US)

(73) Assignee: Applied Materials, Inc., Santa Clara, CA (US)

( * ) Notice: Subject to any disclaimer, the term of this patent is extended or adjusted under 35 U.S.C. 154(b) by 960 days.

(21) Appl. No.: 11/554,954

(22) Filed: Oct. 31, 2006

(65) Prior Publication Data
US 2008/0099933 A1    May 1, 2008

(51) Int. Cl.
B01F 3/04    (2006.01)
(52) U.S. Cl. .................. 261/127; 261/135; 261/142; 261/43; 261/52; 261/61; 261/123
(58) Field of Classification Search ............. 261/43, 261/44.1, 52, 53, 61, 72.1, 121.1, 123, 127, 261/135, 142, 153, DIG. 65
See application file for complete search history.

(56) References Cited

U.S. PATENT DOCUMENTS

| 4,058,430 | A | 11/1977 | Suntola et al. |
| 4,255,961 | A | 3/1981 | Biltonen et al. |
| 4,276,243 | A | 6/1981 | Partus |
| 4,369,031 | A | 1/1983 | Goldman et al. |
| 4,389,973 | A | 6/1983 | Suntola et al. |
| 4,413,022 | A | 11/1983 | Suntola et al. |
| 4,415,275 | A | 11/1983 | Dietrich |

(Continued)

FOREIGN PATENT DOCUMENTS

EP    0 497 267    1/1992

(Continued)

OTHER PUBLICATIONS

Chui, et al. "Syntheses and characterization of organoimido complexes of tantalum; potential single-source precursors to tantalum nitride", Polyhedron vol. 17, No. 13-14, pp. 2187-2190 1998.

(Continued)

*Primary Examiner*—Scott Bushey
(74) *Attorney, Agent, or Firm*—Patterson & Sheridan, LLP

(57) ABSTRACT

A method and apparatus for providing a precursor to a process chamber is described. The apparatus comprises an ampoule capable of receiving either a liquid precursor source material or a solid precursor source material. The ampoule is capable of delivering either a liquid precursor material to a vaporizer coupled to the process chamber, or a vaporized or gaseous precursor material to the process chamber. The ampoule also includes a continuous level sensor to accurately monitor the level of precursor source material within the ampoule.

23 Claims, 4 Drawing Sheets

U.S. PATENT DOCUMENTS

| | | |
|---|---|---|
| 4,717,596 A | 1/1988 | Barbee et al. |
| 4,761,269 A | 8/1988 | Conger et al. |
| 4,783,343 A | 11/1988 | Sato |
| 4,817,557 A | 4/1989 | Diem et al. |
| 4,834,831 A | 5/1989 | Nishizawa et al. |
| 4,911,101 A | 3/1990 | Ballingall, III et al. |
| 4,975,252 A | 12/1990 | Nishizawa et al. |
| 4,993,357 A | 2/1991 | Scholz |
| 5,000,113 A | 3/1991 | Wang et al. |
| 5,027,746 A | 7/1991 | Frijlink |
| 5,098,741 A | 3/1992 | Nolet et al. |
| 5,173,327 A | 12/1992 | Sandhu et al. |
| 5,178,681 A | 1/1993 | Moore et al. |
| 5,221,449 A | 6/1993 | Colgan et al. |
| 5,225,251 A | 7/1993 | Esrom |
| 5,225,366 A | 7/1993 | Yoder |
| 5,261,959 A | 11/1993 | Gasworth |
| 5,281,274 A | 1/1994 | Yoder |
| 5,281,485 A | 1/1994 | Colgan et al. |
| 5,294,286 A | 3/1994 | Nishizawa et al. |
| 5,338,362 A | 8/1994 | Imahashi |
| 5,354,516 A | 10/1994 | Tomita |
| 5,374,570 A | 12/1994 | Nasu et al. |
| 5,381,605 A | 1/1995 | Krafft |
| 5,441,703 A | 8/1995 | Jurgensen |
| 5,443,647 A | 8/1995 | Aucoin et al. |
| 5,480,818 A | 1/1996 | Matsumoto et al. |
| 5,483,919 A | 1/1996 | Yokoyama et al. |
| 5,496,408 A | 3/1996 | Motoda et al. |
| 5,503,875 A | 4/1996 | Imai et al. |
| 5,558,717 A | 9/1996 | Zhao et al. |
| 5,595,603 A | 1/1997 | Klinedinst et al. |
| 5,620,524 A | 4/1997 | Fan et al. |
| 5,630,878 A | 5/1997 | Miyamoto et al. |
| 5,645,642 A | 7/1997 | Nishizato et al. |
| 5,674,574 A | 10/1997 | Atwell et al. |
| 5,674,786 A | 10/1997 | Turner et al. |
| 5,711,811 A | 1/1998 | Suntola et al. |
| 5,730,802 A | 3/1998 | Ishizumi et al. |
| 5,764,849 A | 6/1998 | Atwell |
| 5,796,116 A | 8/1998 | Nakatta et al. |
| 5,807,792 A | 9/1998 | Ilg et al. |
| 5,820,678 A | 10/1998 | Hubert et al. |
| 5,835,677 A | 11/1998 | Li et al. |
| 5,846,332 A | 12/1998 | Zhao et al. |
| 5,855,680 A | 1/1999 | Soininen et al. |
| 5,879,459 A | 3/1999 | Gadgil et al. |
| 5,882,411 A | 3/1999 | Zhao et al. |
| 5,906,683 A | 5/1999 | Chen et al. |
| 5,916,365 A | 6/1999 | Sherman |
| 5,942,089 A | 8/1999 | Sproul et al. |
| 5,951,771 A | 9/1999 | Raney et al. |
| 5,966,499 A | 10/1999 | Hinkle et al. |
| 5,968,588 A | 10/1999 | Sivaramakrishnan et al. |
| 5,972,430 A | 10/1999 | DiMeo, Jr. et al. |
| 6,015,590 A | 1/2000 | Suntola et al. |
| 6,015,595 A | 1/2000 | Felts |
| 6,015,917 A | 1/2000 | Bhandari et al. |
| 6,042,652 A | 3/2000 | Hyun et al. |
| 6,066,358 A | 5/2000 | Guo et al. |
| 6,067,855 A | 5/2000 | Brown et al. |
| 6,071,572 A | 6/2000 | Mosely et al. |
| 6,079,356 A | 6/2000 | Umotoy et al. |
| 6,099,904 A | 8/2000 | Mak et al. |
| 6,107,198 A | 8/2000 | Lin et al. |
| 6,136,725 A | 10/2000 | Loan et al. |
| 6,139,640 A | 10/2000 | Ramos et al. |
| 6,139,700 A | 10/2000 | Kang et al. |
| 6,143,080 A | 11/2000 | Bartholomew et al. |
| 6,143,082 A | 11/2000 | McInerney et al. |
| 6,144,060 A | 11/2000 | Park et al. |
| 6,156,382 A | 12/2000 | Rajagopalan et al. |
| 6,162,488 A | 12/2000 | Gevelber et al. |
| 6,162,715 A | 12/2000 | Mak et al. |
| 6,174,377 B1 | 1/2001 | Doering et al. |
| 6,183,563 B1 | 2/2001 | Choi et al. |
| 6,197,683 B1 | 3/2001 | Kang et al. |
| 6,200,893 B1 | 3/2001 | Sneh |
| 6,203,613 B1 | 3/2001 | Gates et al. |
| 6,206,967 B1 | 3/2001 | Mak et al. |
| 6,224,681 B1 | 5/2001 | Sivaramakrishnan et al. |
| 6,231,672 B1 | 5/2001 | Choi et al. |
| 6,248,434 B1 | 6/2001 | Rodiger et al. |
| 6,251,190 B1 | 6/2001 | Mak et al. |
| 6,270,572 B1 | 8/2001 | Kim et al. |
| 6,271,148 B1 | 8/2001 | Kao et al. |
| 6,287,965 B1 | 9/2001 | Kang et al. |
| 6,305,314 B1 | 10/2001 | Sneh et al. |
| 6,306,216 B1 | 10/2001 | Kim et al. |
| 6,309,713 B1 | 10/2001 | Mak et al. |
| 6,342,277 B1 | 1/2002 | Sherman |
| 6,379,748 B1 | 4/2002 | Bhandari et al. |
| 6,391,785 B1 | 5/2002 | Satta et al. |
| 6,416,577 B1 | 7/2002 | Suntoloa et al. |
| 6,433,314 B1 | 8/2002 | Mandrekar et al. |
| 6,447,607 B2 | 9/2002 | Soininen et al. |
| 6,454,860 B2 | 9/2002 | Metzner et al. |
| 6,475,276 B1 | 11/2002 | Elers et al. |
| 6,478,872 B1 | 11/2002 | Chae et al. |
| 6,481,945 B1 | 11/2002 | Hasper et al. |
| 6,511,539 B1 | 1/2003 | Raaijmakers |
| 6,539,796 B2 | 4/2003 | Shirai et al. |
| 6,548,112 B1 | 4/2003 | Hillman et al. |
| 6,551,406 B2 | 4/2003 | Kilpi |
| 6,551,929 B1 | 4/2003 | Kori et al. |
| 6,561,498 B2 | 5/2003 | Tompkins et al. |
| 6,572,705 B1 | 6/2003 | Suntola et al. |
| 6,578,287 B2 | 6/2003 | Aswad |
| 6,579,372 B2 | 6/2003 | Park |
| 6,593,484 B2 | 7/2003 | Yasuhara et al. |
| 6,630,030 B1 | 10/2003 | Suntola et al. |
| 6,630,201 B2 | 10/2003 | Chiang et al. |
| 6,660,126 B2 | 12/2003 | Nguyen et al. |
| 6,716,287 B1 | 4/2004 | Santiago et al. |
| 6,718,126 B2 | 4/2004 | Lei |
| 6,720,027 B2 | 4/2004 | Yang et al. |
| 6,734,020 B2 | 5/2004 | Lu et al. |
| 6,772,072 B2 | 8/2004 | Ganguli et al. |
| 6,773,507 B2 | 8/2004 | Jallepally et al. |
| 6,777,352 B2 | 8/2004 | Tepman et al. |
| 6,778,762 B1 | 8/2004 | Shareef et al. |
| 6,797,108 B2 | 9/2004 | Wendling |
| 6,815,285 B2 | 11/2004 | Choi et al. |
| 6,818,094 B2 | 11/2004 | Yudovsky |
| 6,821,563 B2 | 11/2004 | Yudovsky |
| 6,827,815 B2 | 12/2004 | Hytros et al. |
| 6,866,746 B2 | 3/2005 | Lei et al. |
| 6,868,859 B2 | 3/2005 | Yudovsky |
| 6,878,206 B2 | 4/2005 | Tzu et al. |
| 6,881,437 B2 | 4/2005 | Ivanov et al. |
| 6,902,624 B2 | 6/2005 | Seidel et al. |
| 6,911,093 B2 | 6/2005 | Stacey et al. |
| 6,915,592 B2 | 7/2005 | Guenther |
| 6,921,062 B2 | 7/2005 | Gregg et al. |
| 6,939,801 B2 | 9/2005 | Chung et al. |
| 6,946,033 B2 | 9/2005 | Tsuei et al. |
| 6,983,892 B2 | 1/2006 | Noorbakhsh et al. |
| 6,998,014 B2 | 2/2006 | Chen et al. |
| 2001/0000866 A1 | 5/2001 | Sneh et al. |
| 2001/0003603 A1 | 6/2001 | Eguchi et al. |
| 2001/0009140 A1 | 7/2001 | Bondestam et al. |
| 2001/0011526 A1 | 8/2001 | Doering et al. |
| 2001/0013312 A1 | 8/2001 | Soininen et al. |
| 2001/0014371 A1 | 8/2001 | Kilpi |

| | | | | | | |
|---|---|---|---|---|---|---|
| 2001/0028924 | A1 | 10/2001 | Sherman | 2003/0221780 A1 | 12/2003 | Lei et al. |
| 2001/0041250 | A1 | 11/2001 | Werkhoven et al. | 2003/0224107 A1 | 12/2003 | Lindfors et al. |
| 2001/0042523 | A1 | 11/2001 | Kesala | 2003/0235961 A1 | 12/2003 | Metzner et al. |
| 2001/0042799 | A1 | 11/2001 | Kim et al. | 2004/0005749 A1 | 1/2004 | Choi et al. |
| 2001/0054377 | A1 | 12/2001 | Lindfors et al. | 2004/0011404 A1 | 1/2004 | Ku et al. |
| 2001/0054769 | A1 | 12/2001 | Raaijmakers et al. | 2004/0011504 A1 | 1/2004 | Ku et al. |
| 2002/0000196 | A1 | 1/2002 | Park | 2004/0013577 A1 | 1/2004 | Ganguli et al. |
| 2002/0007790 | A1 | 1/2002 | Park et al. | 2004/0014320 A1 | 1/2004 | Chen et al. |
| 2002/0009544 | A1 | 1/2002 | McFeely et al. | 2004/0015300 A1 | 1/2004 | Ganguli et al. |
| 2002/0009896 | A1 | 1/2002 | Sandhu et al. | 2004/0016404 A1 | 1/2004 | Gregg et al. |
| 2002/0013051 | A1 | 1/2002 | Hautala et al. | 2004/0025370 A1 | 2/2004 | Guenther |
| 2002/0017242 | A1 | 2/2002 | Hamaguchi et al. | 2004/0065255 A1 | 4/2004 | Yang et al. |
| 2002/0031618 | A1 | 3/2002 | Sherman | 2004/0069227 A1 | 4/2004 | Ku et al. |
| 2002/0041931 | A1 | 4/2002 | Suntola et al. | 2004/0071897 A1 | 4/2004 | Verplancken et al. |
| 2002/0052097 | A1 | 5/2002 | Park | 2004/0144308 A1 | 7/2004 | Yudovsky |
| 2002/0066411 | A1 | 6/2002 | Chiang et al. | 2004/0144311 A1 | 7/2004 | Chen et al. |
| 2002/0073924 | A1 | 6/2002 | Chiang et al. | 2004/0203254 A1 | 10/2004 | Conley, Jr. et al. |
| 2002/0076481 | A1 | 6/2002 | Chiang et al. | 2004/0219784 A1 | 11/2004 | Kang et al. |
| 2002/0076507 | A1 | 6/2002 | Chiang et al. | 2004/0224506 A1 | 11/2004 | Choi et al. |
| 2002/0076508 | A1 | 6/2002 | Chiang et al. | 2004/0235285 A1 | 11/2004 | Kang et al. |
| 2002/0076837 | A1 | 6/2002 | Hujanen et al. | 2004/0253375 A1 | 12/2004 | Ivanov et al. |
| 2002/0086106 | A1 | 7/2002 | Park et al. | 2004/0262327 A1* | 12/2004 | Birtcher et al. ............... 222/64 |
| 2002/0092471 | A1 | 7/2002 | Kang et al. | 2005/0006799 A1 | 1/2005 | Gregg et al. |
| 2002/0094689 | A1 | 7/2002 | Park | 2005/0059240 A1 | 3/2005 | Choi et al. |
| 2002/0104481 | A1 | 8/2002 | Chiang et al. | 2005/0064207 A1 | 3/2005 | Senzaki et al. |
| 2002/0108570 | A1 | 8/2002 | Lindfors | 2005/0070126 A1 | 3/2005 | Senzaki |
| 2002/0110991 | A1 | 8/2002 | Li | 2005/0095859 A1 | 5/2005 | Chen et al. |
| 2002/0115886 | A1 | 8/2002 | Yasuhara et al. | 2005/0104142 A1 | 5/2005 | Narayanan et al. |
| 2002/0121241 | A1 | 9/2002 | Nguyen et al. | 2005/0153571 A1 | 7/2005 | Senzaki |
| 2002/0121342 | A1 | 9/2002 | Nguyen et al. | 2005/0233156 A1 | 10/2005 | Senzaki et al. |
| 2002/0127336 | A1 | 9/2002 | Chen et al. | 2005/0255243 A1 | 11/2005 | Senzaki |
| 2002/0127745 | A1 | 9/2002 | Lu et al. | 2008/0182425 A1* | 7/2008 | Spohn et al. ............... 438/758 |
| 2002/0132473 | A1 | 9/2002 | Chiang et al. | | | |
| 2002/0134307 | A1 | 9/2002 | Choi | | | |

FOREIGN PATENT DOCUMENTS

| | | | |
|---|---|---|---|
| 2002/0144655 A1 | 10/2002 | Chiang et al. | |
| 2002/0144657 A1 | 10/2002 | Chiang et al. | EP | 1 077 484 | 2/2001 |
| 2002/0145210 A1 | 10/2002 | Tompkins et al. | EP | 1 079 001 | 2/2001 |
| 2002/0146511 A1 | 10/2002 | Chiang et al. | EP | 1 167 569 | 6/2001 |
| 2002/0155722 A1 | 10/2002 | Satta et al. | GB | 2 151 662 | 7/1985 |
| 2003/0004723 A1 | 1/2003 | Chihara | GB | 2 223 509 A | 4/1990 |
| 2003/0010451 A1 | 1/2003 | Tzu et al. | GB | 2 355 727 A | 5/2001 |
| 2003/0017697 A1 | 1/2003 | Choi et al. | JP | 56-035426 | 4/1981 |
| 2003/0023338 A1 | 1/2003 | Chin et al. | JP | 58-98917 | 6/1983 |
| 2003/0042630 A1 | 3/2003 | Babcoke et al. | JP | 01-175225 | 7/1989 |
| 2003/0049375 A1 | 3/2003 | Nguyen et al. | JP | 04-291916 | 9/1992 |
| 2003/0053799 A1 | 3/2003 | Lei | JP | 05-047666 | 2/1993 |
| 2003/0057527 A1 | 3/2003 | Chung et al. | JP | 05-206036 | 8/1993 |
| 2003/0072913 A1 | 4/2003 | Chou et al. | JP | 05-234899 | 9/1993 |
| 2003/0075273 A1 | 4/2003 | Kilpela et al. | JP | 05-270997 | 10/1993 |
| 2003/0075925 A1 | 4/2003 | Lindfors et al. | JP | 06-224138 | 5/1994 |
| 2003/0079686 A1 | 5/2003 | Chen et al. | JP | 06-317520 | 11/1994 |
| 2003/0082307 A1 | 5/2003 | Chung et al. | JP | 2000122725 | 4/2000 |
| 2003/0089308 A1 | 5/2003 | Raaijmakers | JP | 2000212752 | 8/2000 |
| 2003/0101927 A1 | 6/2003 | Raaijmakers | JP | 2000319772 | 11/2000 |
| 2003/0101938 A1 | 6/2003 | Ronsse et al. | JP | 2001020075 | 1/2001 |
| 2003/0106490 A1 | 6/2003 | Jallepally et al. | JP | 2001-172767 | 6/2001 |
| 2003/0113187 A1 | 6/2003 | Lei et al. | WO | WO 96/17107 | 6/1996 |
| 2003/0116087 A1 | 6/2003 | Nguyen et al. | WO | WO 99/01595 | 1/1999 |
| 2003/0121241 A1 | 7/2003 | Belke | WO | WO 99/29924 | 6/1999 |
| 2003/0121469 A1 | 7/2003 | Lindfors et al. | WO | WO 99/65064 | 12/1999 |
| 2003/0121608 A1 | 7/2003 | Chen et al. | WO | WO 00/16377 | 3/2000 |
| 2003/0140854 A1 | 7/2003 | Kilpi | WO | WO 00/54320 | 9/2000 |
| 2003/0143328 A1 | 7/2003 | Chen et al. | WO | WO 00/79575 | 12/2000 |
| 2003/0143747 A1 | 7/2003 | Bondestam et al. | WO | WO 00/79576 | 12/2000 |
| 2003/0144657 A1 | 7/2003 | Bowe et al. | WO | WO 01/15220 | 3/2001 |
| 2003/0153177 A1 | 8/2003 | Tepman et al. | WO | WO 01/17692 | 3/2001 |
| 2003/0172872 A1 | 9/2003 | Thakur et al. | WO | WO 01/27346 | 4/2001 |
| 2003/0194493 A1 | 10/2003 | Chang et al. | WO | WO 01/27347 | 4/2001 |
| 2003/0198740 A1 | 10/2003 | Wendling | WO | WO 01/29891 | 4/2001 |
| 2003/0198754 A1 | 10/2003 | Xi et al. | WO | WO 01/29893 | 4/2001 |
| 2003/0213560 A1 | 11/2003 | Wang et al. | WO | WO 01/36702 | 5/2001 |
| 2003/0216981 A1 | 11/2003 | Tillman | WO | WO 01/66832 | 9/2001 |
| 2003/0219942 A1 | 11/2003 | Choi et al. | WO | WO 02/08488 | 1/2002 |

| | | |
|---|---|---|
| WO | WO 02/43115 | 5/2002 |
| WO | WO 02/45167 | 6/2002 |
| WO | WO 02/45871 | 6/2002 |
| WO | WO 03/004723 | 1/2003 |
| WO | WO 03/023835 | 3/2003 |
| WO | WO 99/08491 | 1/2004 |

OTHER PUBLICATIONS

Hartje, et al. "CVD reactor source—has irradiated surface to vaporize surface of reaction component held solid by internal cooling," Patent No. DD 274057, Dec. 6, 1989, AKAD Wissenschaften DDR, Derwent WPI File, Record No. 008261396, Abstract.

Hiltunen, et al. "Nitrides of Titanium, Niobium, Tantalum and Molybdenum Grown as Thin Films by the Atomic Layer Epitaxy Method," Thin Solid Films, 166 (1988) pp. 149-154.

Leskela, et al. "Atomic Layer Epitaxy in Deposition of Various Oxide and Nitride Thin Films," Journal De Physique IV, Colloque C5, Supplement au Journal de Physique II, vol. 5, Jun. 1995 pp. C5-937-C5-951.

NEC Corp., "Gasifier for sublimation for CVD unit—has container for solid material, $1^{st}$ heater, $2^{nd}$ heater to heat gas trapped by mesh structure, etc.," Patent No. 5-214537, Aug. 24, 1993, Derwent WPI File, Record No. 009606474, Abstract.

Pamplin, Crystal Growth, pp. 227-229, Pergamon Press, sec. edition vol. 16 1981.

Partial Search Report for PCT/US02/02651 dated Oct. 25, 2002 (Annex to Form PCT/ISA/206).

PCT Search Report for PCT/US02/34277 dated May 9, 2003 (AMAT/5192.PC.03).

PCT Search Report for PCT/US03/22186 dated Apr. 14, 2004 (AMAT/6798.PC).

Ravetz, et al. "Properties of Solution TMI™ as an OMVPE Source," J. Electron. Mater. (USA) vol. 29, No. 1, pp. 156-160, Jan. 2000.

Ritala, et al. "Controlled Growth of TaN, $Ta_3N_5$, and $TaO_xN_y$ Thin Films by Atomic Layer Deposition," Chem. Mater., vol. 11, No. 7, 1999, pp. 1712-1718.

Rossnagel, et al. "Plasma-Enhanced Atomic Layer Deposition of Ta and Ti for Interconnect Diffusion Barriers," J. Vac. Sci. Technol. B 18(4), Jul./Aug. 2000, pp. 2016-2020.

* cited by examiner

US 7,775,508 B2

AMPOULE FOR LIQUID DRAW AND VAPOR DRAW WITH A CONTINUOUS LEVEL SENSOR

BACKGROUND OF THE INVENTION

1. Field of the Invention

Embodiments described herein generally relate to a precursor source canister, also known as an ampoule, for providing a precursor material to a processing chamber. More particularly, to an ampoule capable of providing a liquid precursor material and/or a vaporized solid precursor material to the processing chamber.

2. Description of the Related Art

Chemical vapor deposition (CVD) and atomic layer deposition (ALD) are known techniques for forming a layer or layers of a material on a substrate, such as a semiconductor wafer. The material is generally formed by the reaction of vapor phase chemicals on and/or near the surface of the substrate. Typically, CVD and ALD processes involve the delivery of gaseous reactants to the substrate surface where a chemical reaction takes place under temperature and pressure conditions favorable to the thermodynamics of the reaction. The type, composition, deposition rate, and thickness uniformity of the materials that may be formed using a conventional CVD or ALD processes are generally limited by the ability to deliver chemical reactants or precursors to the substrate surface.

The precursors may originate from either a liquid precursor material or a solid precursor material. Generally, the liquid precursor material is provided to the processing chamber by a vaporizer, which generates a vapor phase precursor from the liquid precursor material and delivers the vapor phase material to the processing chamber. Solid precursor materials are typically heated and pressurized to sublimate the solid precursor material into a vapor phase precursor material, which is delivered to the processing chamber using a carrier gas.

Various conventional devices are commercially available for delivery of precursors to the substrate surface and typically have the form of a sealed canister, also known as an ampoule. The liquid or solid precursor material is provided to the canister and heated and/or pressurized to provide liquid or vapor to the processing chamber.

However, the conventional devices are typically configured solely for either liquid injection or vapor draw, and are not easily adapted to function for both liquid and solid precursor source materials. Thus, if a user needs to convert from a solid precursor material to a liquid precursor material, or vice versa, the ampoule must be changed. This results in at least two ampoules per processing chamber, which results in higher capital outlay for multiple ampoules. Also, the time required to remove and replace ampoules decreases throughput. Further, the conventional devices typically lack a sensor to accurately and continuously determine and monitor precursor source material levels within the ampoule.

Therefore, there is a need for an improved ampoule suitable for use with both liquid and solid precursor materials having a continuous level sensor.

SUMMARY OF THE INVENTION

Embodiments described herein relate to an ampoule capable of liquid injection and vapor delivery. In some embodiments, the ampoule includes a continuous level sensor.

In one embodiment, an apparatus for containing a precursor material is described. The apparatus includes a canister having a top, bottom, and sidewalls, a first and second inlet valve coupled to the canister, and a first and second outlet valve coupled to the canister, wherein the first inlet valve is adapted to receive a carrier gas to provide a vapor to the first outlet valve, and the second inlet valve is adapted to receive a carrier gas to provide a liquid to the second outlet valve.

In another embodiment, an apparatus for containing a precursor material is described. The apparatus includes a canister having a top, bottom, and sidewalls defining an interior volume, a first port and a second port formed through the canister, the ports in fluid communication with the interior volume, a first and second inlet valve, and a first and second outlet valve, wherein the first port is coupled to the first inlet valve and the second outlet valve, and the second port is coupled to the second inlet valve and the first outlet valve.

In another embodiment, an apparatus for containing a precursor material is described. The apparatus includes a canister having a top, bottom, and sidewalls defining an interior volume, the bottom having a curved inner surface, a heater coupled to the sidewalls, a continuous level sensor in communication with the interior volume and having an end disposed in a recess formed in the curved inner surface of the bottom, a first and second inlet valve coupled to a first inlet port formed through the top, and a first and second outlet valve coupled to a second inlet port formed through the top, wherein the first inlet valve is adapted to receive a carrier gas to provide a vapor to the first outlet valve, and the second inlet valve is adapted to receive a carrier gas to provide a liquid to the second outlet valve.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

To facilitate understanding, identical reference numerals have been used, where possible, to designate identical elements that are common to the figures. It is also contemplated that elements disclosed in one embodiment may be beneficially utilized on other embodiments without specific recitation.

DETAILED DESCRIPTION

Figure 1:
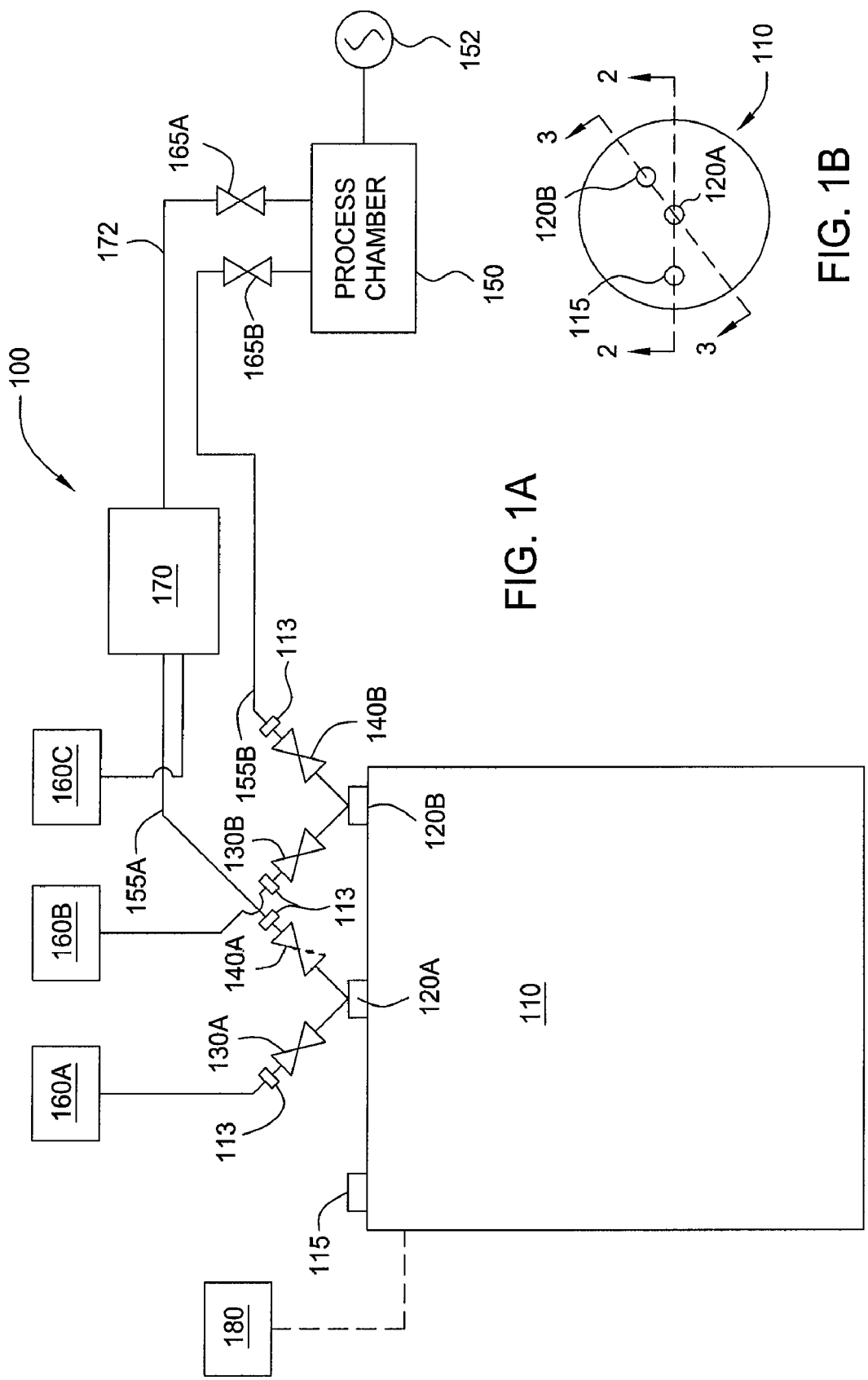
FIG. 1A is a schematic view of one embodiment of a processing system.
FIG. 1B is a top view of the ampoule depicted in FIG. 1A.

Embodiments described herein relate to a source canister, also known as an ampoule, for delivering a precursor material to a processing chamber. The ampoule is capable of supplying a liquid or a gas to the processing chamber from either a liquid or solid source. The ampoule may also include a continuous level sensor to provide an accurate level metric of at least a liquid source material within the ampoule.

FIG. 1A is a schematic view of one embodiment of a processing system 100. The processing system 100 includes a source canister, or ampoule 110, fluidly coupled to a process chamber 150. The ampoule 110 is configured to receive a precursor source material that may be in liquid or solid form, and is adapted to generate a liquid or gaseous precursor from the precursor source material. In one embodiment, the ampoule 110 may be coupled to a remote precursor material source 180 adapted to provide liquid or solid precursor source materials to the ampoule 110 as needed, or the ampoule 110 may be opened to replenish the precursor source material within the ampoule 110.

In one example, a liquid precursor source material may be introduced into the ampoule 110. The liquid precursor source material may be vaporized within the ampoule 110 to generate a gaseous or vapor phase precursor material from the liquid precursor source material. In another example, the liquid precursor source material may be delivered from the ampoule 110 and injected into a vaporizer 170 to generate a gaseous or vapor phase precursor material from the liquid precursor source material. Alternatively, a solid precursor source material may be introduced into the ampoule 110 to generate a gaseous or vaporized precursor material from the solid precursor source material.

The ampoule 110 includes at least a first port 120A and a second port 120B that are in fluid communication with an interior volume of the ampoule 110. The ampoule 110 may also include a sensor port 115 that is adapted to receive a sensor (shown in FIG. 2) adapted to provide a metric indicative of the level of precursor source material within the ampoule 110. The ampoule 110 also includes a plurality of inlet valves 130A, 130B, and a plurality of outlet valves 140A, 140B coupled to ports 120A, 120B, respectively. Port 120A is adapted to couple to a first inlet valve 130A and a second outlet valve 140A, while port 120B is adapted to couple a first outlet valve 140B to and a second inlet valve 130B. The inlet valves 130A, 130B are coupled to carrier gas sources 160A, 160B, respectively, which may be gases, such as argon, helium, nitrogen, hydrogen, or combinations thereof, among other carrier gases. The carrier gas may originate from a common source container, or separate source containers 160A, 160B, as shown. The carrier gas sources 160A, 160B may be coupled to the inlet valves 130A, 130B by fittings 113, such as SWAGELOCK™ fittings, VCR® fittings, quick-connect fittings, and the like. The outlet valves 140A, 140B are coupled to a liquid conduit 155A and a gas conduit 155B, respectively. The outlet valves 140A, 140B may be coupled to the process chamber 150 by fittings 113 as described above.

The ampoule 110 includes at least two flow paths determined by a process and the state of the precursor source material chosen and/or used in the process. In one embodiment, a first flow path facilitates generation of a vapor or gaseous precursor material from a solid precursor source material. The solid precursor source material disposed in the interior volume of the ampoule 110 may be heated to sublimate or vaporize the solid precursor source material to generate a vapor or gaseous precursor material. A carrier gas from carrier gas source 160A is supplied along a portion of the first flow path to the ampoule 110 through valve 130A. The carrier gas continues to flow along the first flow path into the interior volume of the ampoule 110 through port 120A and facilitates flow of a vaporized or gaseous precursor material to port 120B, as will be described in detail in reference to FIG. 3. The gaseous precursor material and the carrier gas flows through valve 140B and is provided to the process chamber 150 via gas conduit 155B along the final portion of the first flow path.

The gas conduit 155B may be heated, such as by a resistive heater, a heater jacket, heating tape, and the like (not shown). A valve 165B may be provided between the process chamber 150 and outlet valve 140B to control flow of the gaseous precursor material into the process chamber 150 from gas conduit 155B.

In another embodiment, a second flow path facilitates generation of a precursor material from a liquid precursor source material. The liquid precursor source material is disposed in the interior volume of the ampoule 110 and may be heated to heat the liquid precursor source material. A carrier gas from carrier gas source 160B is supplied along a portion of the second flow path to the ampoule 110 through valve 130B. The carrier gas continues to flow along the second flow path into the interior volume of the ampoule 110 through port 120B and facilitates flow of a liquid precursor material to port 120A, as will be described in detail in reference to FIG. 2. The liquid precursor material flows through valve 140A into a liquid conduit 155A. The liquid conduit 155A may also include a vaporizer 170, which may be a heated mass flow controller adapted to vaporize liquid precursor material from the ampoule 110. The vaporizer 170 is coupled with a carrier gas source 160C that provides a carrier gas, such as argon, helium, nitrogen, hydrogen, or combinations thereof. The carrier gas provided from source 160C assists the flow of the vaporized liquid precursor material through vapor conduit 172 into the process chamber 150. A valve 165A may be coupled to the process chamber 150 to control flow of the vaporized precursor material from vapor conduit 172. The liquid conduit 155A and/or the gas conduit 172 may be heated, such as by a heater jacket, heating tape, and the like (not shown).

The vaporized liquid precursor material from vapor conduit 172, or the gaseous precursor material from gas conduit 155B is provided to the process chamber 150 for a deposition process within the chamber. The process chamber 150 may be any chamber adapted to deposit a material on a substrate, such as a chemical vapor deposition (CVD) chamber or an atomic layer deposition (ALD) chamber. Examples of process chamber 150 include PRODUCER® CVD chambers, DZX® CVD chambers, CENTURA® i SPRINT™ ALD/CVD chambers, and ENDURA® i CUBS™ ALD/PVD chambers available from Applied Materials, located in Santa Clara, Calif. ALD and CVD chambers from other manufacturers may also be used.

The process chamber 150 may be configured for ALD, CVD, and/or pulsed CVD, and is typically coupled with an RF power source 152 configured to energize gases provided to the interior volume of the process chamber 150. Valves 165A, 165B may be coupled to the process chamber 150 to control vaporized precursor material from vapor conduit 172, and gaseous precursor material from gas conduit 155B, respectively. Valves 165A, 165B may be electronically, mechanically, magnetically, or pneumatically controlled valves, and are configured to provide pulses or continuous streams of the vaporized or gaseous precursor material to the process chamber 150. Valves 165A, 165B may be configured to provide a pulse (i.e. an opened/closed cycle) within a range between about 10 milliseconds to about 5 seconds. In one example, the valve may be quickly pulsed for less than about 1 second, such as between about 10 milliseconds to about 1 second, for example, between about 50 milliseconds to 700 milliseconds, or between about 100 milliseconds to about 500 milliseconds. In another example, the valves 165A, 165B may be pulsed for a longer duration, such as for more than about 1 second, such as between about 1 second to about 5 seconds, for example, from about 1.5 seconds to 4 seconds, or from about 2 seconds to about 3 seconds.

Examples of suitable precursor source materials disposed in the ampoule 110 and/or delivered from remote precursor material source 180 include titanium tetrachloride ($TiCl_4$), tetrakis(dimethylamido)titanium (TDMAT, ($Me_2N)_4Ti$)), tetrakis(diethylamido)titanium (TEMAT, ($Et_2N)_4Ti$)), bis(ethylcyclopentadienyl)ruthenium (($EtCp)_2Ru$), bis(dimethylpentadienyl)ruthenium, bis(diethylpentadienyl)ruthenium, tetrakis(dimethylamido)hafnium (TDMAH, ($Me_2N)_4Hf$)), tetrakis(diethylamido)hafnium (TDEAH, ($Et_2N)_4Hf$)), tetrakis(methylethylamido)hafnium (TMEAH, ($MeEtN)_4Hf$)), tertbutylimido-tris(dimethylamido) tantalum (TBTDAT, ($^tBuN)Ta(NMe_2)_3$), tertbutylimido-tris(diethylamido)tantalum (TBTDET, ($^tBuN)Ta(NEt_2)_3$), tertbutylimido-tris(methylethylamido)tantalum (TBTMET, ($^tBuN)Ta(NMe_2)_3$), pentakis(dimethylamido)tantalum (PDMAT, $Ta(NMe_2)_5$), tertiaryamylimido-tris(dimethylamido)tantalum (TAIMATA, ($^tAmylN)Ta(NMe_2)_3$), wherein $^tAmyl$ is the tertiaryamyl group ($C_5H_{11}$— or $CH_3CH_2C(CH_3)_2$—), derivatives thereof, or combinations thereof. Other suitable exemplary precursor source materials include water, hydrogen peroxide ($H_2O_2$), ammonia ($NH_3$), hydrazine ($N_2H_4$). Suitable silicon precursor source materials include silane ($SiH_4$), disilane ($Si_2H_6$), chlorosilane ($SiH_3Cl$), dichlorosilane ($SiH_2Cl_2$), trichlorosilane ($SiHCl_3$), silicon tetrachloride ($SiCl_4$), hexachlorodisilane ($Si_2Cl_6$), and derivatives thereof. Other precursor source materials may include ruthenium sources as described in U.S. patent application Ser. No. 10/811,230, filed Mar. 26, 2004, which published as U.S. publication No. 2004/0241321 on Dec. 2, 2004, and is incorporated by reference herein to the extent it is not inconsistent with this disclosure.

Figure 2:
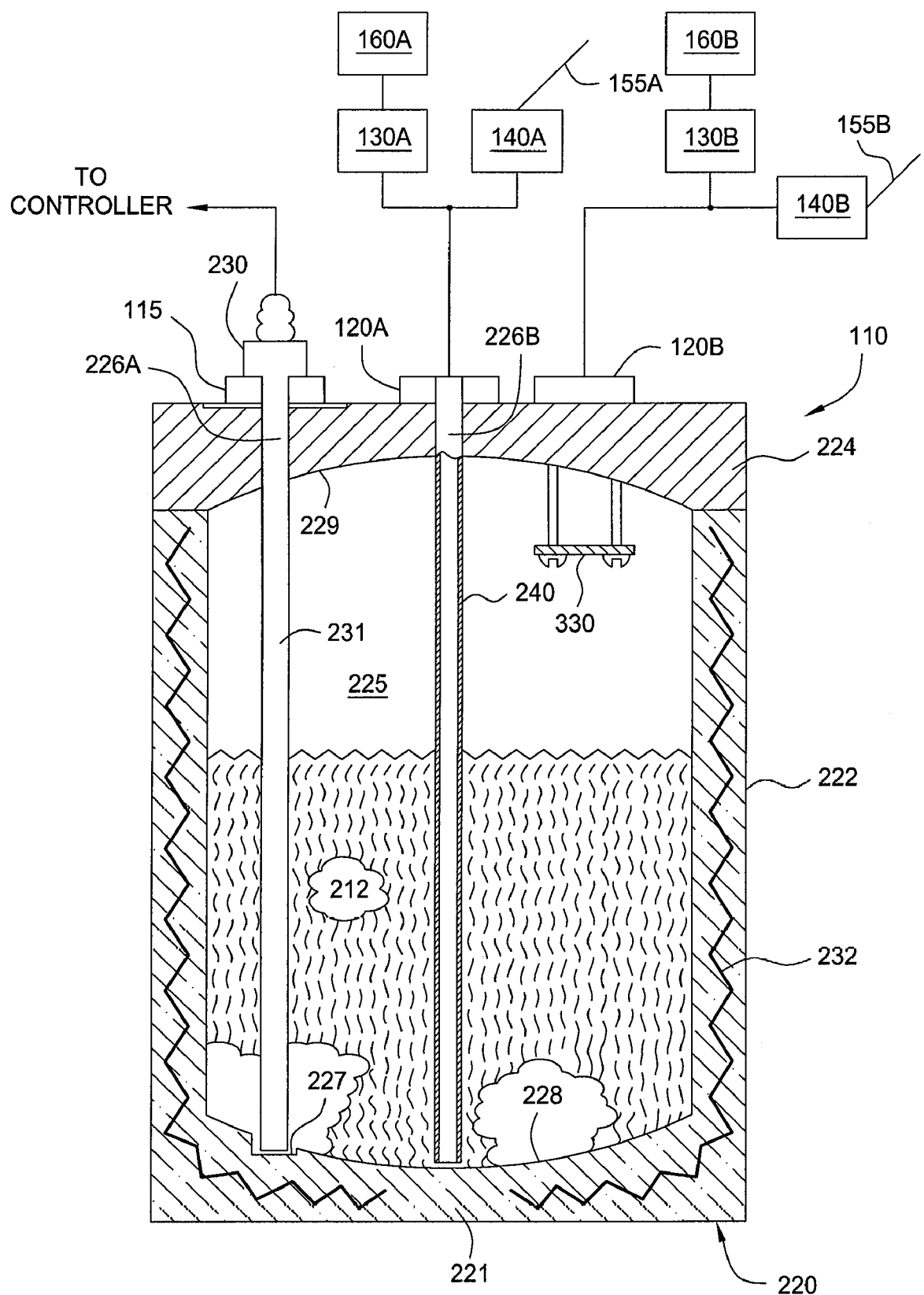
FIG. 2 is a sectional side view of one embodiment of the ampoule depicted in FIG. 1B.

FIG. 2 is a sectional side view of the ampoule 110 taken along section 2-2 of FIG. 1B. In one embodiment, the ampoule 110 may be a canister 220. The canister 220 includes a bottom 221, a top 224, and sidewalls 222, which define an interior volume 225. In this view, the interior volume 225 is partially filled with a liquid precursor source material 212 disposed therein as an example only. The liquid precursor source material 212 may be introduced into the interior volume 225 by removing the top 224, or from the remote precursor material source 180 coupled to the canister 220 by a port formed in a surface of the canister 220 (not shown). The liquid precursor source material 212 may be any suitable precursor source materials listed above, although any liquid precursor source material may be used. In one embodiment, the top 224 may include an inner surface 229 that is at least partially curved in cross-section, such as a concave surface, allowing higher pressures within the interior volume 225, when needed. In one embodiment, the top 224 is removable to receive the liquid precursor source materials 212. The top 224 is adapted to seal with the upper surface of the sidewall 222, and may include seals, such as an o-ring made of a metal or a process compatible polymer, to facilitate sealing between the top 224 and the sidewall 222. Fasteners or clamps (not shown), such as bolts, screws, latches, and the like, may facilitate coupling and sealing of the top 224 to the sidewall 222.

The top 224 also includes openings 226A, 226B aligned with ports 115 and 120A, respectively. The sidewall 222 may interface a heating means 232 that may also interface a substantial portion of the bottom 221 to facilitate heating of the materials and/or fluids present within the interior volume 225. The heating means 232 may be disposed in the interior volume 225, embedded in the canister 220, disposed outside and coupled to the canister 220, or a combination thereof. The heating means 232 may be a resistive heater, heating tape coupled to the sidewall 222, heated circulated fluid, one or more cartridge heaters, or combinations thereof.

Opening 226A is adapted to receive a level sensor 230 that is in sensing communication with the interior volume 225 to monitor the level of solids and/or fluids within the interior volume 225. In one embodiment, the level sensor 230 is a continuous level sensor as opposed to point level sensors, which may not provide adequate level information between pre-defined points. The continuous level sensor is adapted to continuously monitor the level of precursor source material either constantly or intermittently to provide a level metric with enhanced accuracy, and is configured to enable usage of the precursor source material to levels that may not be attained by point level sensors. This enables more accurate determinations of refill periods, thus increasing the efficiency of the process.

In another embodiment, the level sensor 230 is a continuous level sensor that is capacitance or admittance-based and comprises a probe 231 that extends into the interior volume 225. The level sensor 230 and the probe 231 are hermetically sealed with the canister 220 and are made of materials that are non-reactive with the precursor source materials within the interior volume 225. The level sensor 230 is adapted to provide a continuous and accurate level metric of any fluids and/or solids within the interior volume 225 by providing a level reading about every 50 milliseconds.

The canister 220 may be made of process resistant materials, such as stainless steel, platinum, INCONEL®, nickel, and, alloys thereof, and ceramic materials, and combinations thereof. The canister 220 is configured to withstand temperatures above about 90 degrees Celsius (C), such as between about 80 degrees C. to about 175 degrees C., for example, between about 90 degrees C. to about 150 degrees C. The level sensor 230 is made of materials configured to withstand temperatures of below about 175 degrees C., such as about 150 degrees C., and pressures up to 2000 pounds per square inch (psi), and is coupled to the canister 220 in a manner that thermally insulates portions of the sensor 230 that are not in contact with the precursor source material.

Opening 226B is configured to receive and seal with a tube 240 that extends into the interior volume 225. The tube 240 is coupled to port 120A which is coupled to outlet valve 140A and inlet valve 130A. The tube 240 is made of process resistant materials, such as stainless steel, INCONEL®, platinum, and the like. In one mode of operation, the tube 240 is configured to provide a carrier gas to the interior volume 225 to facilitate operation of the first flow path. In another mode of operation, the tube 240 is configured to draw liquid precursor source material 212 from the interior volume 225 into the liquid conduit 155A to facilitate operation of the second flow path.

The bottom 221 of the canister 220 includes an interior surface 228 that is curved in cross-section, such as a concave shape, in order to enable more complete usage of the liquid precursor source material 212. The tube 240 extends to a lower portion of the interior surface 228 to enhance usage of the liquid precursor source material 212. When liquid precursor source material 212 is used in the canister 220, the concave interior surface 228 allows usage of the liquid precursor source material 212 down to a level of less than about 50 $cm^3$, for example, to a level equal or less than about 30 $cm^3$. The bottom 221 also includes a recess 227 formed in the interior surface 228 configured to receive a portion of the probe 231. The recess 227 is configured to provide a local pocket for liquid to reside during processing. The volume of the recess 237 may be configured to include a volume that equates to about 80% of the unused liquid. The recess 237 may also be configured to retain the probe 231 within the interior volume 225 in a substantially vertical, stable position, which enables more accurate and repeatable sensor readings by preventing the sensor from becoming misaligned during filling and use of the ampoule 110.

Figure 3:
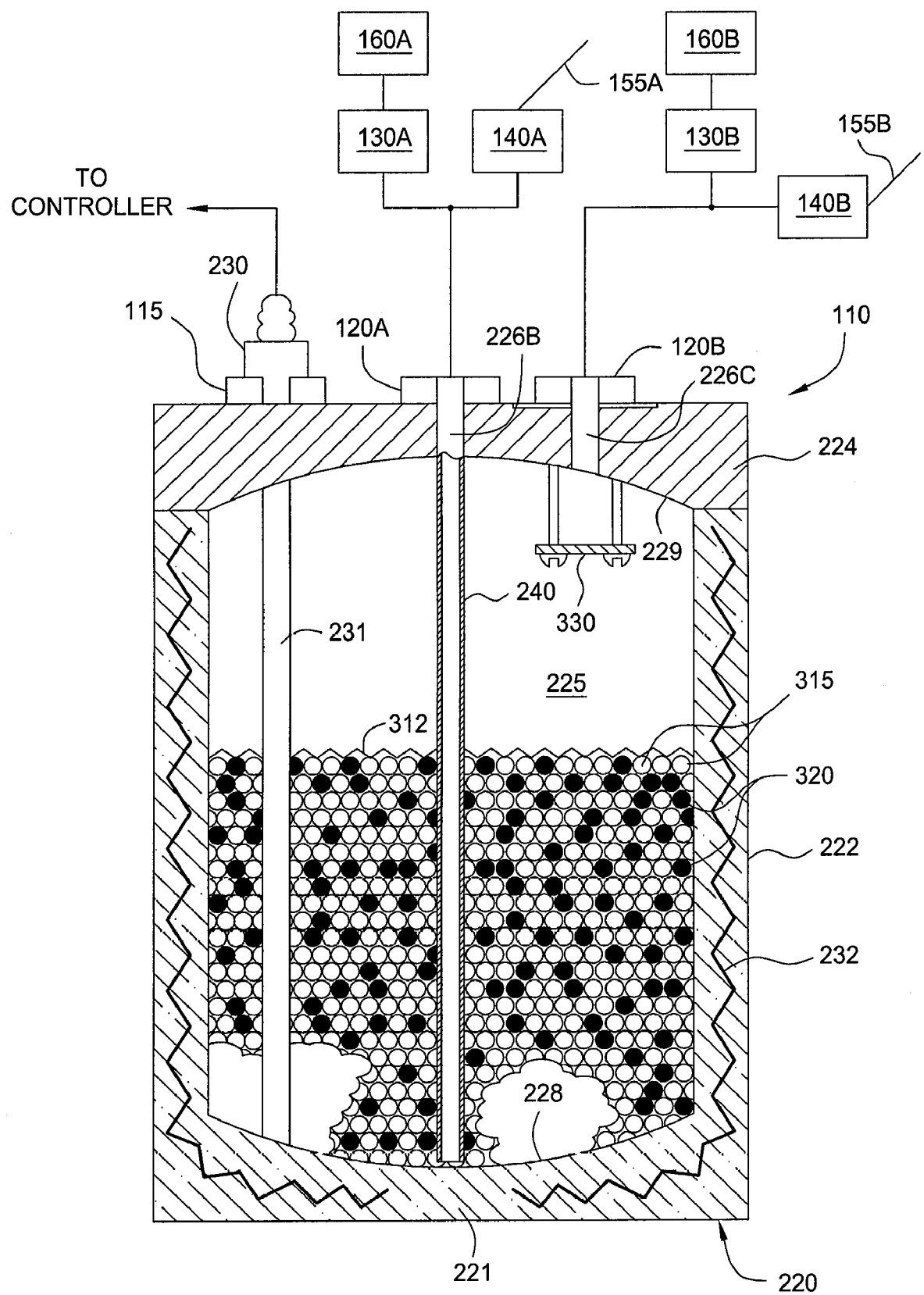
FIG. 3 is a sectional side view of another embodiment of the ampoule depicted in FIG. 1B.

FIG. 3 is schematic side view of the ampoule 110 taken from section 3-3 of FIG. 1B. In this embodiment, the canister 220 is partially filled with a solid precursor source material 315 instead of the liquid precursor source material 212 shown in FIG. 2. In the embodiment depicted in FIG. 3, the ampoule 110 is adapted for providing a gaseous or vaporized precursor material to the outlet valve 140B. The solid precursor source material 315 may be any suitable precursor source material listed above, although any solid precursor source material may be used. The solid precursor source material 315 may be introduced into the interior volume 225 by removing the top 224, or from the remote precursor material source 180 coupled to the canister 220 by a port formed in a surface of the canister 220 (not shown).

In addition to the solid precursor source material 315, a liquid may be added to the solid precursor source material in the canister 220 to form a slurry 312 that may aid in heat transfer from sidewall 222. The liquid forming the slurry 312 is non-reactive with the precursor source material 315 and has a negligible vapor pressure compared to the precursor source material 315. A plurality of solid beads or particles 320 with high thermal conductivity may be disposed in the interior volume 225 to facilitate heat conductance within the interior volume 225. The solid particles 320 may be used to enhance the heat transfer between the sidewall 222 of the canister 220 and the precursor source material 315. The solid particles 320 may have substantially the same properties as the liquid forming the slurry 312 in that the particles 320 are non-reactive with the precursor source material 315, insoluble, and have a negligible vapor pressure compared to the precursor source materials 315. The solid particles 320 may also be degassed and cleaned from contaminants, water vapor, and the like, prior to being introduced into the canister 220. Examples of a slurry and solid particles adapted for use in the canister 220 may be aluminum nitride or boron nitride, for example, which is described in U.S. patent application Ser. No. 11/119,681, filed May 2, 2005, which published as U.S. 2005/0189072 on Sep. 1, 2005, and is incorporated by reference herein to the extent the application is not inconsistent with this disclosure.

The top 224 includes an opening 226C that is coupled to the port 120B, which is adapted to allow passage of a vapor or gas to the outlet valve 140B. The inlet valve 130B is coupled to carrier gas 160B through port 120B. The canister 220 also includes a bottom surface 228 and a top surface 229 as shown in FIG. 2. The interior surface 228 of the bottom 221 may also include a recess 227, which allows the probe 231 to engage or be below the curvature of the bottom surface 228. A splash guard 330 is also coupled to the lid 224 to prevent liquid from entering the opening 226C. A trap (not shown) may also be coupled to or between the port 120B and the outlet valve 140B to prevent or minimize liquids, or other contaminants, from entering the valve 140B.

In an operation referring to FIGS. 1 and 2, the ampoule 110 may be configured for liquid injection. When liquid precursor source material is preferred for the process chamber 150, the ampoule 110 may be filled with a liquid precursor source material 212. The liquid precursor source material 212 may be heated by the heating means 232. Carrier gas from carrier gas source 160B may be provided through inlet valve 130B and into the interior volume 225 through the opening 226C. The carrier gas from source 160B pressurizes the interior volume 225 of the ampoule 110 and facilitates liquid precursor material flowing through the tube 240 and opening 226B. The liquid precursor material will then be flowed through the outlet valve 140A into the liquid conduit 155A when the outlet valve 140A is opened. The liquid precursor material will then flow through the vaporizer 170 for vaporization of the liquid precursor material. A carrier gas from carrier gas source 160C is coupled with the vaporizer 170 in order to facilitate flowing of the vaporized liquid precursor from the vaporizer 170 to the chamber 150 through the heated vapor conduit 172. In this manner, the vaporized liquid precursor may be provided to the process chamber 150 for use in a deposition process. An example of a suitable vaporization device is described in U.S. Pat. No. 7,055,808, filed Nov. 26, 2002, and issued Jun. 6, 2006, which is incorporated by reference to the extent the application is not inconsistent with this disclosure. Since the tube 240 is at or near the lower surface 228 of the canister 220, substantially all of the liquid precursor source material 212 may be used. In one embodiment, the liquid precursor source material 212 may be used to a level of less than about 50 cm$^3$, for example, to a level equal or less than about 30 cm$^3$. When the liquid precursor source material 212 reaches the lower level, the liquid precursor source material may be replenished by opening the top 224, through the sensor port 115 by removing the sensor 230, or from the remote precursor material source 180.

In another example referring to FIGS. 1 and 3, if a solid precursor source material is preferred for the process chamber 150, the solid precursor source material 315 is provided to the ampoule 110 as described above. Liquid to form slurry 312 and/or solid particles 320 may also be provided to the canister 220 by removing the top 224, from sensor port 115 by removing sensor 230, or from a port formed in the canister (not shown). The solid precursor source material 315 is heated in order to promote vaporization and/or sublimation the solid precursor source material. A carrier gas from carrier gas source 160A is fed through the inlet valve 130A into the interior volume 225 of the ampoule 110. The carrier gas flows through the tube 240 and is released into the solid precursor source material 315. Since the lower end of tube 240 is at or near the bottom 221 of the canister 220, the carrier gas flows through the solid precursor source material 315 towards opening 226C, which enhances the sublimation process and/or delivery of the vaporized solid precursor. The vaporized solid precursor then flows through the port 120B coupled to the opening 226C into the vapor conduit 155B when outlet valve 140B is opened. Any contaminants, such as liquid, oil, or other contaminants, may be removed from the vaporized solid precursor by a trap (not shown) coupled to the port 120B. In this manner, the vaporized solid precursor may be provided to the process chamber 150 for use in a deposition process.

Figure 4:
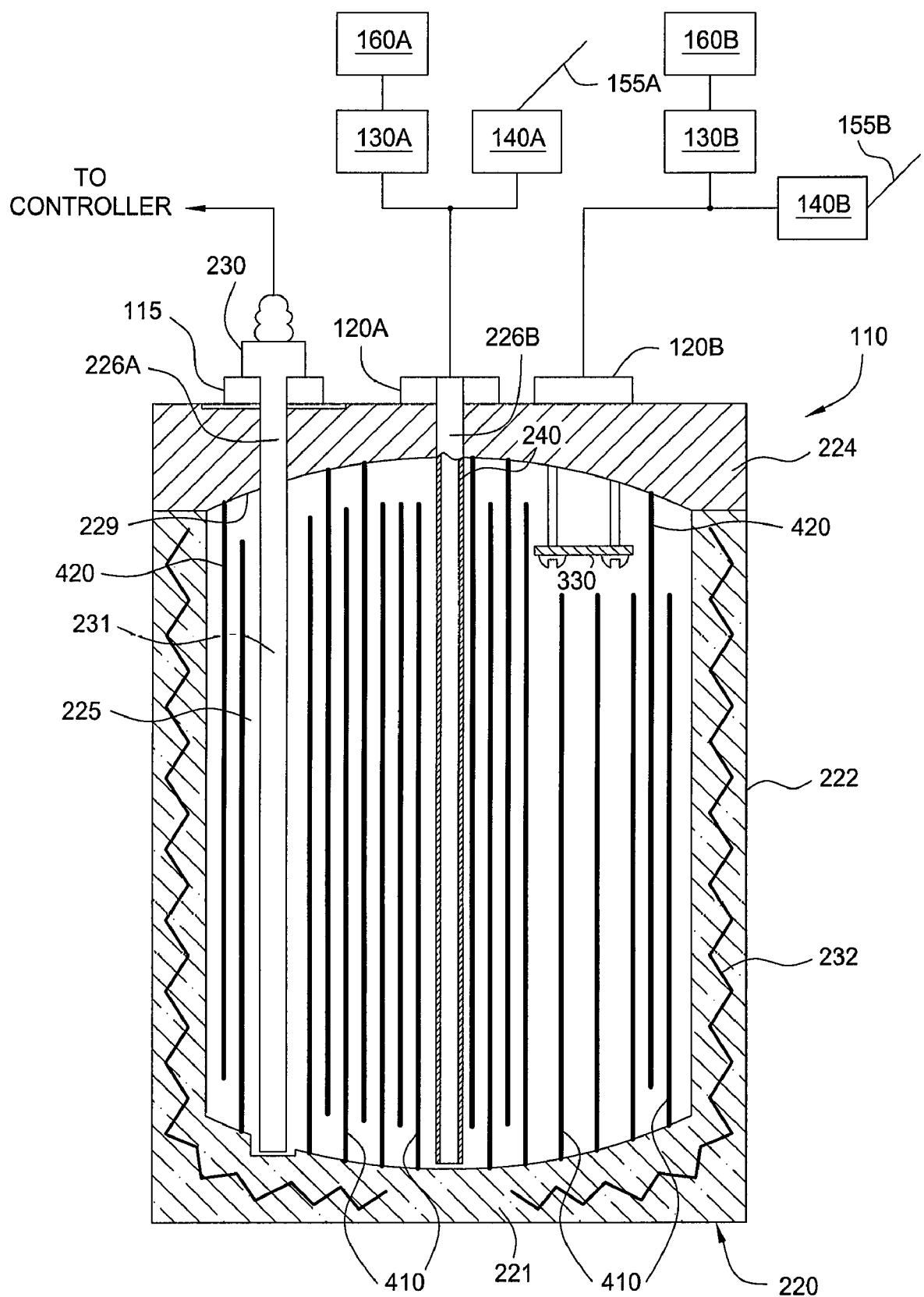
FIG. 4 is a sectional side view of another embodiment of an ampoule.

FIG. 4 is another embodiment of the ampoule shown in FIG. 1. The ampoule 110 is the same as shown in FIGS. 2 and 3 with the addition of baffles 410 and 420. The baffles 410 extend upward into the interior volume 225 and are coupled with the bottom surface 228. The baffles 420 are coupled with the top 224 and extend into the interior volume 225 toward the bottom 221. The baffles are adapted to facilitate heat transfer in the liquid or solid precursor source material 212, 315, in the interior volume 225. The baffles 410 and 420 may be made of any process resistant materials, such as metals or ceramics, and may be coupled to the lid 224 and/or bottom 221 by fasteners, welding, brazing, or other joining method. The baffles 410, 420 may also increase dwell time and/or extend the flow path of carrier gas within the interior volume 225.

While the foregoing is directed to embodiments of the present invention, other and further embodiments of the invention may be devised without departing from the basic scope thereof, and the scope thereof is determined by the claims that follow.

The invention claimed is:

1. An apparatus for containing a precursor material, comprising:
    a canister having a top, bottom, and sidewalls;
    a first and second inlet valve coupled to the canister; and
    a first and second outlet valve coupled to the canister, wherein the first inlet valve is adapted to receive a carrier gas to provide a vapor to the first outlet valve, and the second inlet valve is adapted to receive a carrier gas to provide a liquid to the second outlet valve.

2. The apparatus of claim 1, wherein the canister further comprises:
    a continuous level sensor.

3. The apparatus of claim 1, wherein the canister further comprises:
    a capacitance based level sensor.

4. The apparatus of claim 1, wherein the canister further comprises:
    a heater.

5. The apparatus of claim 1, wherein the first inlet valve and second outlet valve are coupled to a first common port formed through the canister.

6. The apparatus of claim 5, wherein the second inlet valve and the first outlet valve are coupled to a second common port formed through the canister.

7. The apparatus of claim 1, wherein the canister further comprises:
    a first port having the first inlet valve and the second outlet valve coupled thereto; and
    a second port having the second inlet valve and the first outlet valve coupled thereto.

8. The apparatus of claim 1, wherein the canister further comprises:
    a tubular member disposed in an interior volume, wherein one end of the tubular member is disposed proximate a lower surface of the canister.

9. The apparatus of claim 1, wherein the canister further comprises:
    a port formed in an upper surface thereof of an interior volume having a splash guard coupled thereto.

10. The apparatus of claim 1, wherein the canister further comprises:
    an interior volume bounded by a curved upper and lower surface.

11. The apparatus of claim 1, wherein the canister further comprises:
    means for transferring heat within an interior volume of the canister.

12. The apparatus of claim 11, wherein the means for transferring heat is selected from the group consisting of baffles, a slurry, a plurality of solid particles, and combinations thereof.

13. An apparatus for containing a precursor material, comprising:
    a canister having a top, bottom, and sidewalls defining an interior volume;
    a first port and a second port formed through the canister, the ports in fluid communication with the interior volume;
    a first and second inlet valve; and
    a first and second outlet valve, wherein the first port is coupled to the first inlet valve and the second outlet valve, and the second port is coupled to the second inlet valve and the first outlet valve.

14. The apparatus of claim 13, wherein the canister further comprises:
    a capacitance based level sensor.

15. The apparatus of claim 13, wherein the canister further comprises:
    a heater.

16. The apparatus of claim 13, wherein the canister further comprises:
    a tubular member coupled to the first port and disposed in the interior volume, the tubular member configured to receive one of a carrier gas or a liquid precursor material.

17. The apparatus of claim 13, wherein the canister further comprises:
    a curved upper and lower surface bounding the interior volume; and
    a recess formed in the lower surface.

18. The apparatus of claim 13, wherein the canister further comprises:
    a curved upper and lower surface bounding the interior volume.

19. The apparatus of claim 13, wherein the interior volume further comprises:
    means for transferring heat within the interior volume.

20. The apparatus of claim 19, wherein the means for transferring heat is selected from the group consisting of baffles, a slurry, a plurality of solid particles, and combinations thereof.

21. An apparatus for containing a precursor material, comprising:
    a canister having a top, bottom, and sidewalls defining an interior volume, the top and bottom having curved inner surfaces;
    a heater coupled to the sidewalls;
    a continuous level sensor in communication with the interior volume and having an end retained by a recess formed in the curved inner surface of the bottom;
    a first and second inlet valve coupled to a first inlet port formed through the top; and
    a first and second outlet valve coupled to a second inlet port formed through the top, wherein the first inlet valve is adapted to receive a carrier gas to provide a vapor to the first outlet valve, and the second inlet valve is adapted to receive a carrier gas to provide a liquid to the second outlet valve.

22. The apparatus of claim 21, wherein the continuous level sensor further comprises:
    a capacitance based level sensor.

23. The apparatus of claim 21, wherein the canister further comprises:
    a splash guard coupled to the inner surface of the top.

* * * * *